US010388800B1

(12) United States Patent
Sung et al.

(10) Patent No.: US 10,388,800 B1
(45) Date of Patent: Aug. 20, 2019

(54) THIN FILM TRANSISTOR WITH GATE STACK ON MULTIPLE SIDES

(71) Applicant: Intel Corporation, Santa Clara, CA (US)

(72) Inventors: Seung Hoon Sung, Portland, OR (US); Abhishek A. Sharma, Hillsboro, OR (US); Van H. Le, Beaverton, OR (US); Gilbert Dewey, Hillsboro, OR (US); Jack Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/941,623

(22) Filed: Mar. 30, 2018

(51) Int. Cl.
*H01L 29/10* (2006.01)
*H01L 29/786* (2006.01)
*H01L 27/092* (2006.01)
*H01L 29/24* (2006.01)
*H01L 29/66* (2006.01)
*H01L 29/423* (2006.01)

(52) U.S. Cl.
CPC .... *H01L 29/78696* (2013.01); *H01L 27/0922* (2013.01); *H01L 29/24* (2013.01); *H01L 29/42392* (2013.01); *H01L 29/66969* (2013.01); *H01L 29/7869* (2013.01); *H01L 29/78618* (2013.01)

(58) Field of Classification Search
CPC ............... H01L 29/78696; H01L 29/24; H01L 29/42392; H01L 29/66969; H01L 29/78618; H01L 29/7869; H01L 27/0922
USPC ........................................................... 257/43
See application file for complete search history.

(56) References Cited

U.S. PATENT DOCUMENTS

2002/0047826 A1* 4/2002 Akimoto ............. G09G 3/3648
345/100
2014/0339546 A1* 11/2014 Yamazaki ......... H01L 29/78603
257/43

* cited by examiner

*Primary Examiner* — Tu-Tu V Ho
(74) *Attorney, Agent, or Firm* — Green, Howard & Mughal LLP

(57) ABSTRACT

A thin film transistor (TFT) device is provided, where the TFT may include a plurality of stacked structures comprising metal oxide. In an example, any two adjacent structures of the plurality of stacked structures may be separated by a corresponding intervening structure. In an example, the TFT may also include gate dielectric material on at least a first side and a second side of the plurality of stacked structures. In an example, the TFT may further include a gate electrode comprising a first section and a second section, where the first and second sections of the gate electrode may be respectively on the first side and the second side of the plurality of stacked structures.

20 Claims, 15 Drawing Sheets

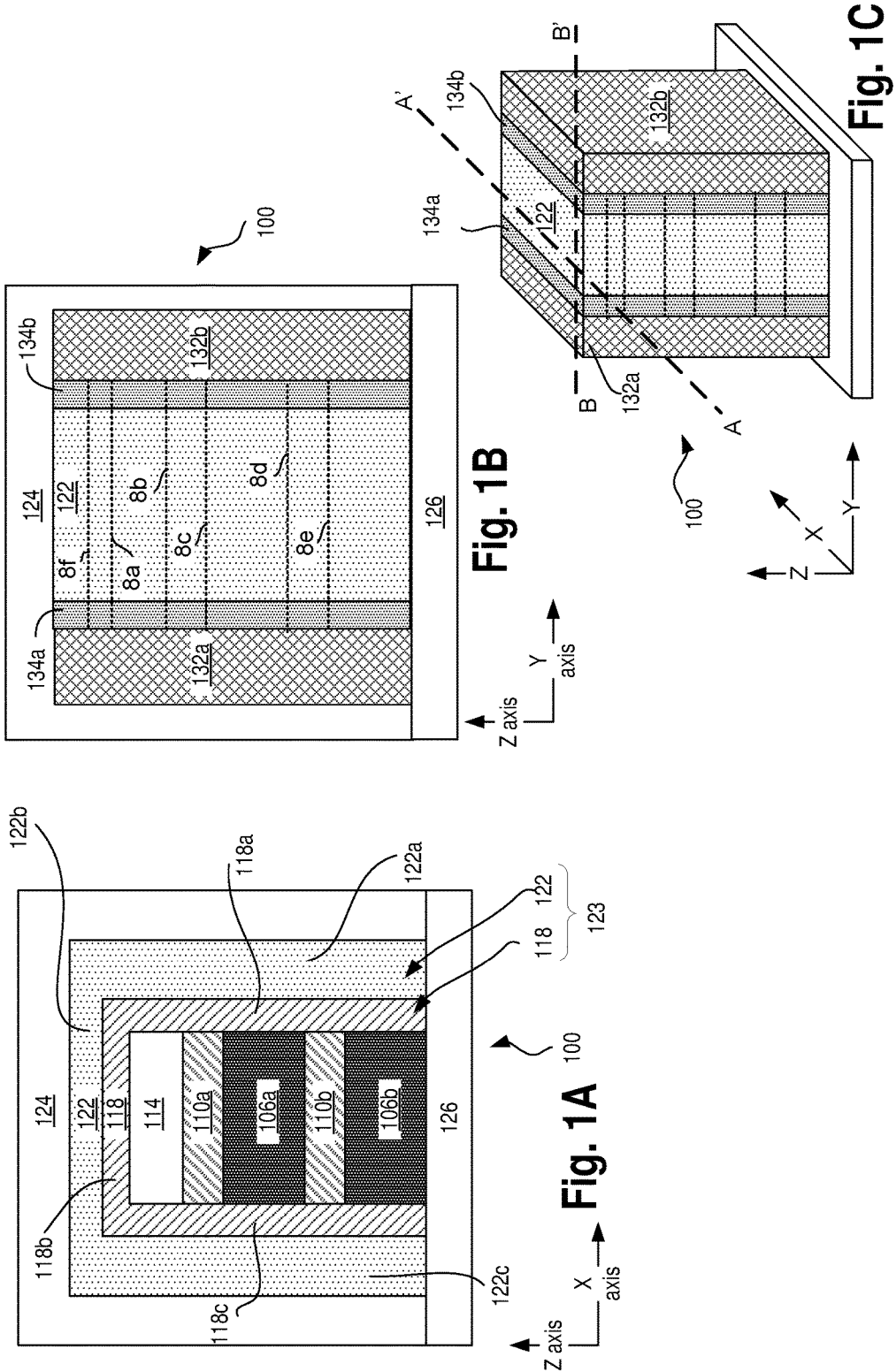

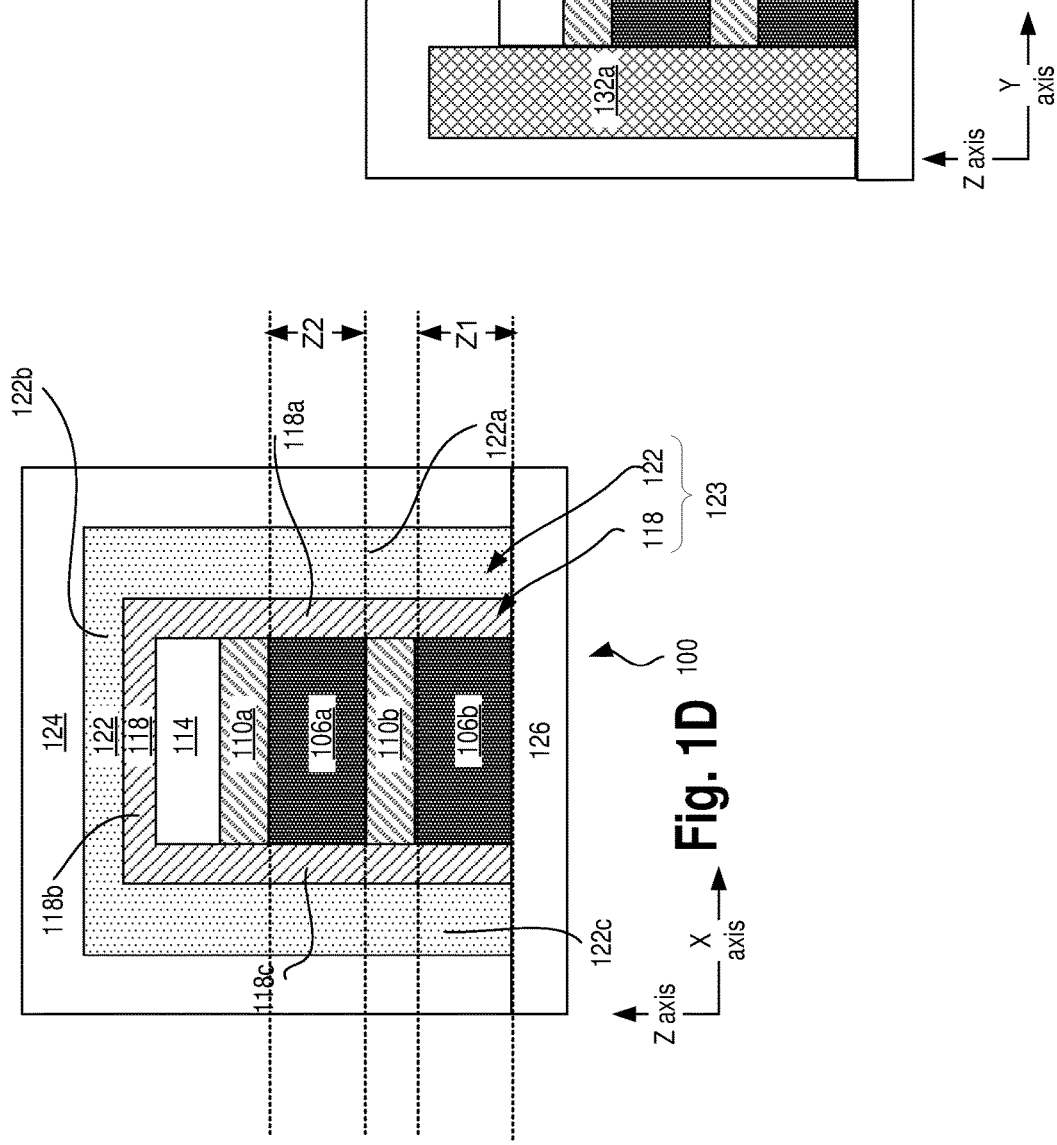

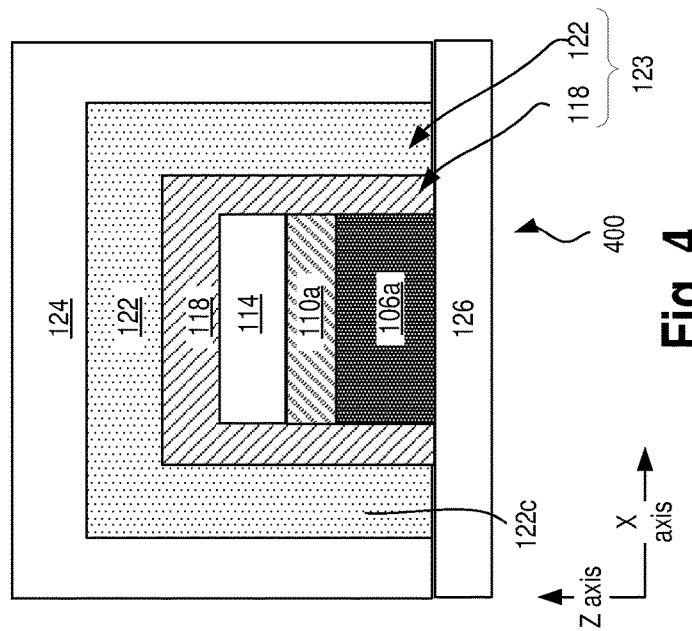
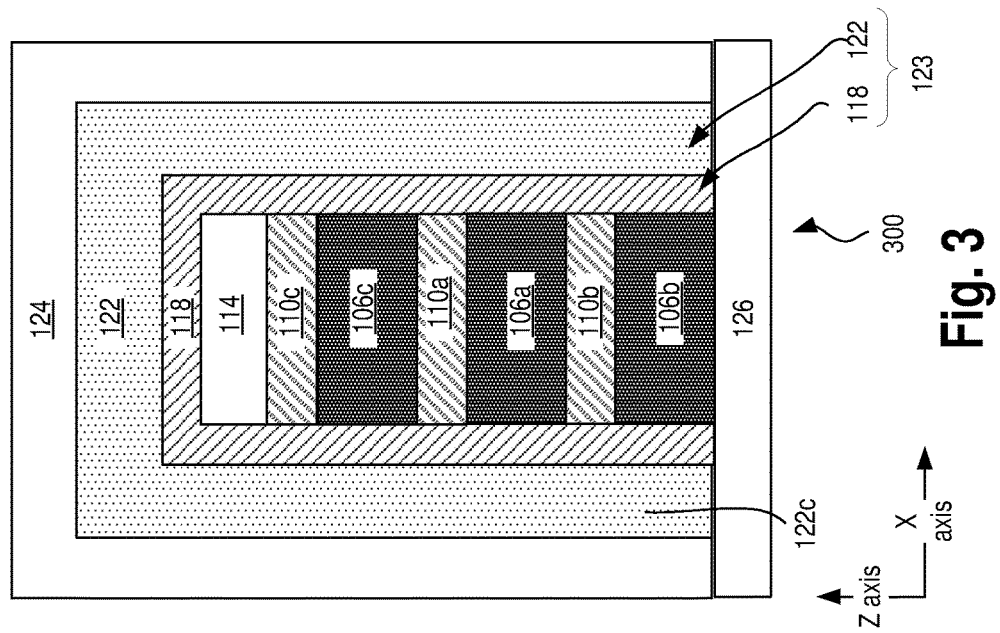

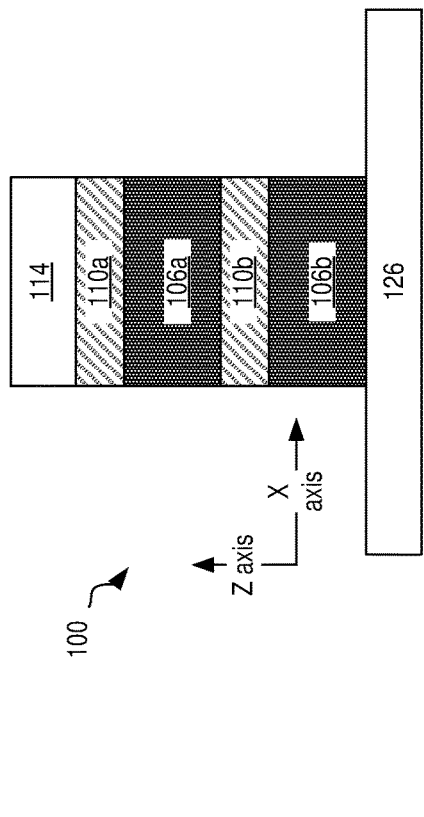
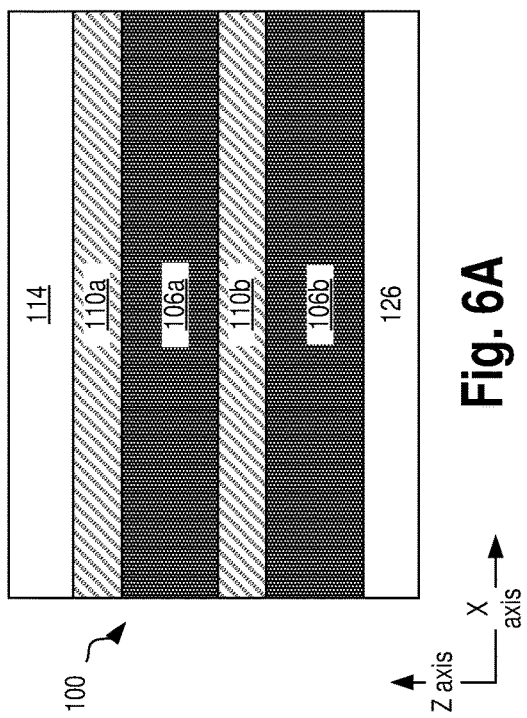
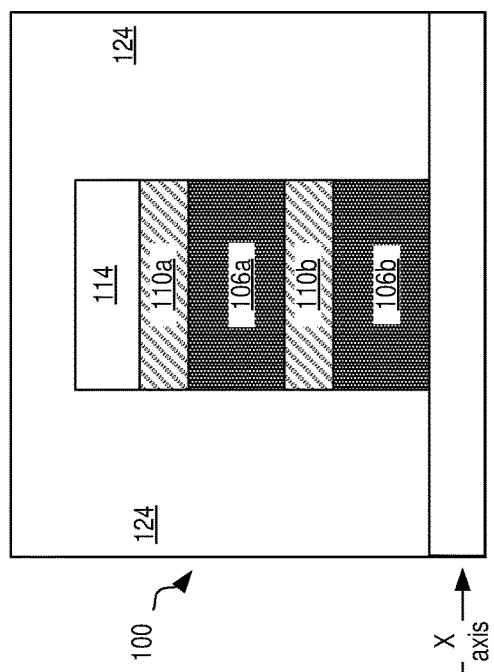

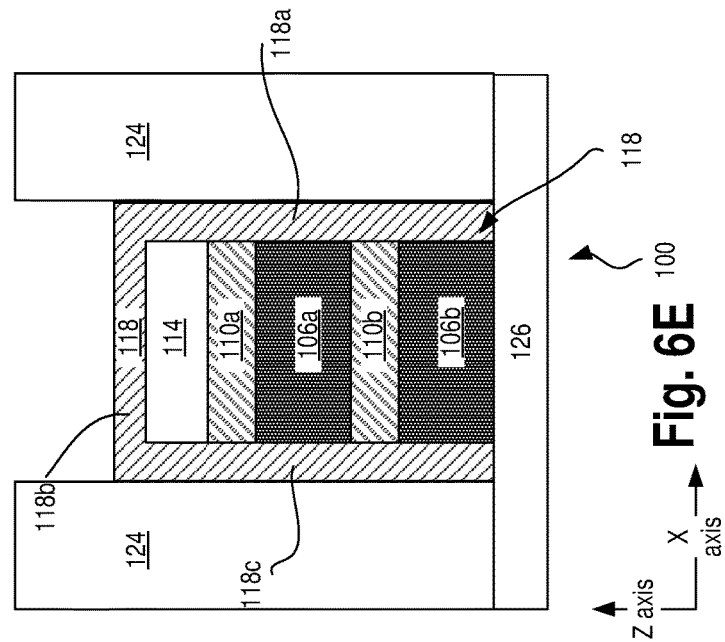
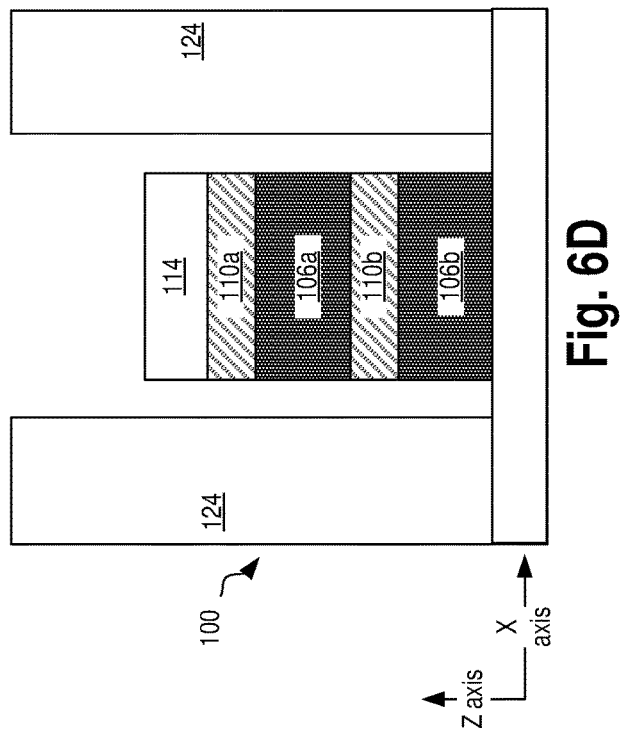

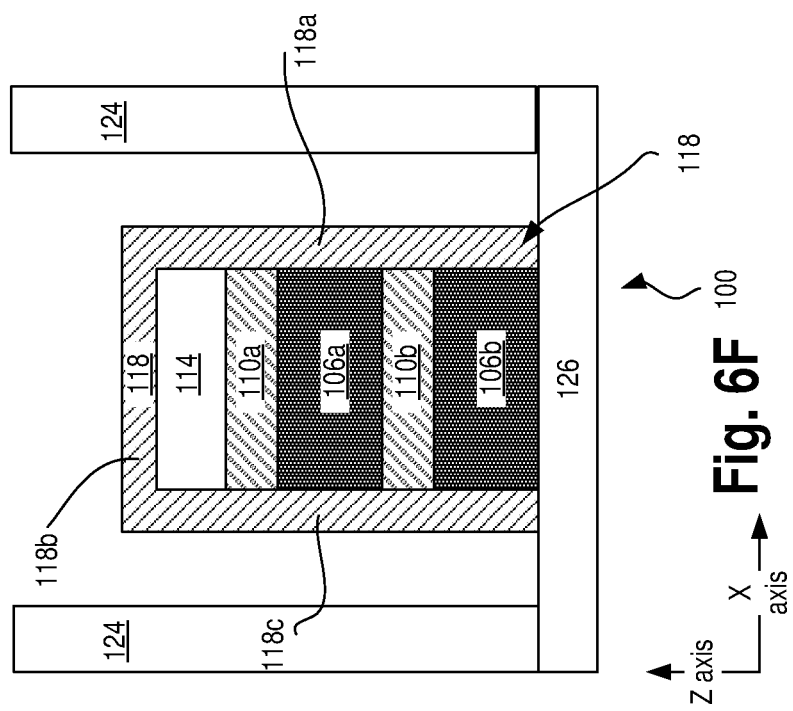

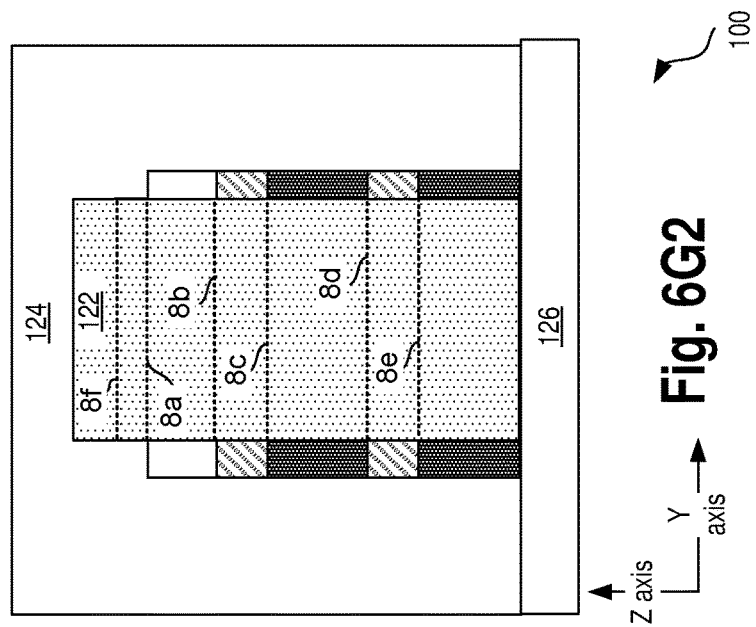
Fig. 6G2
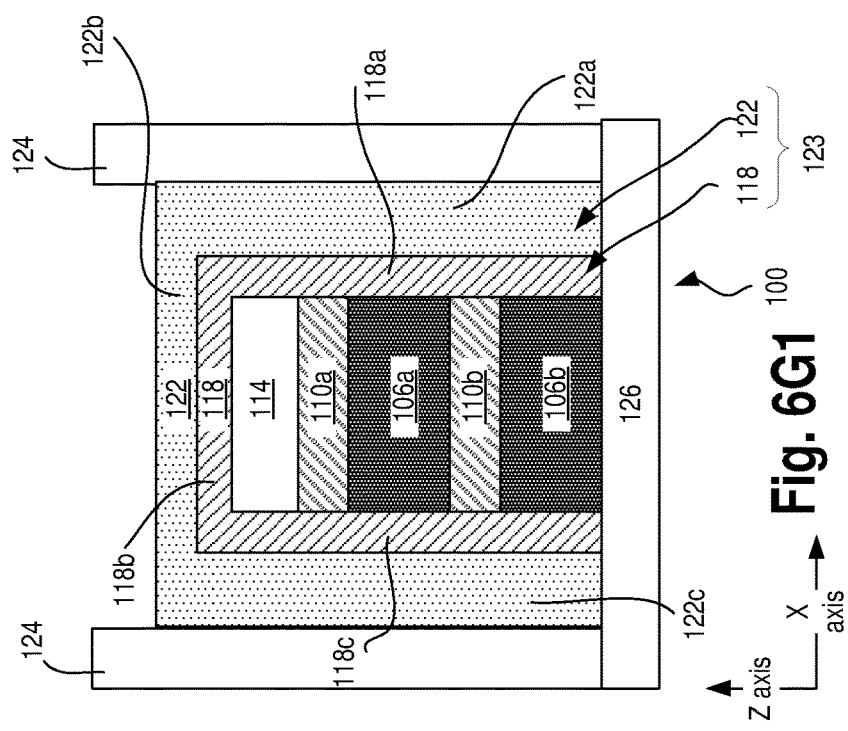
Fig. 6G1

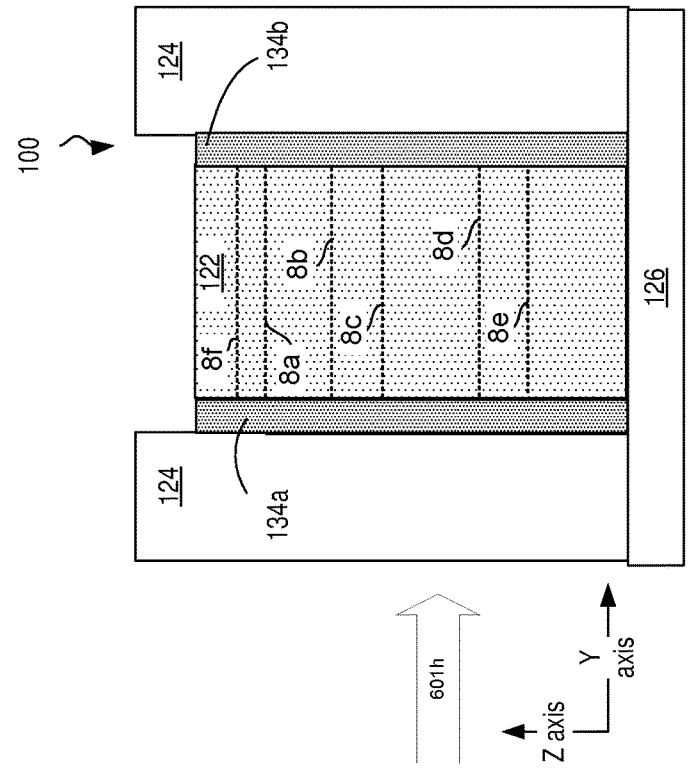
Fig. 6H2
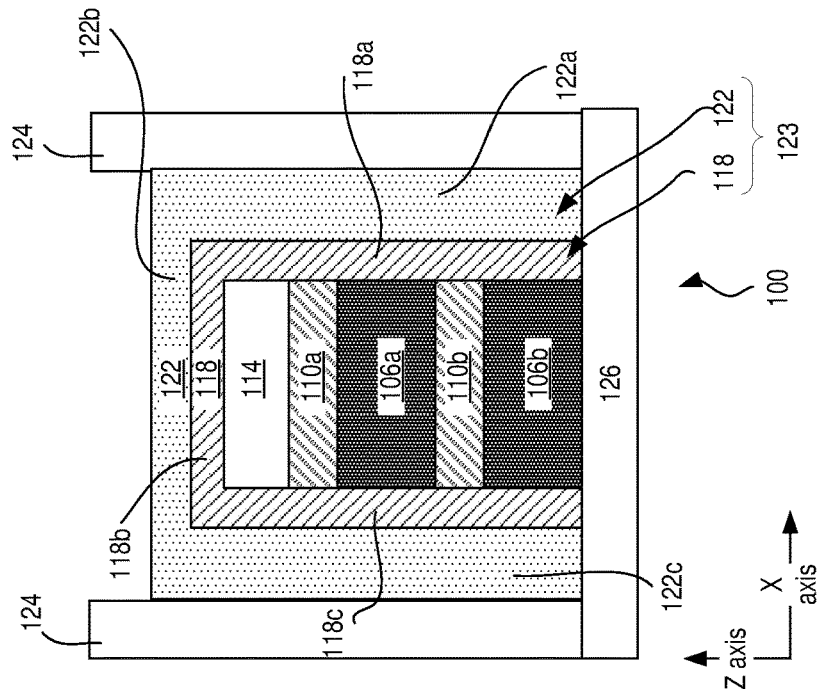
Fig. 6H1

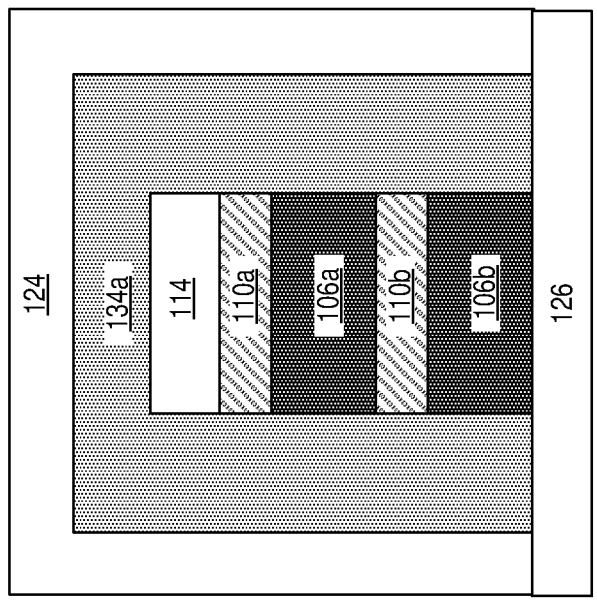
Fig. 6H3

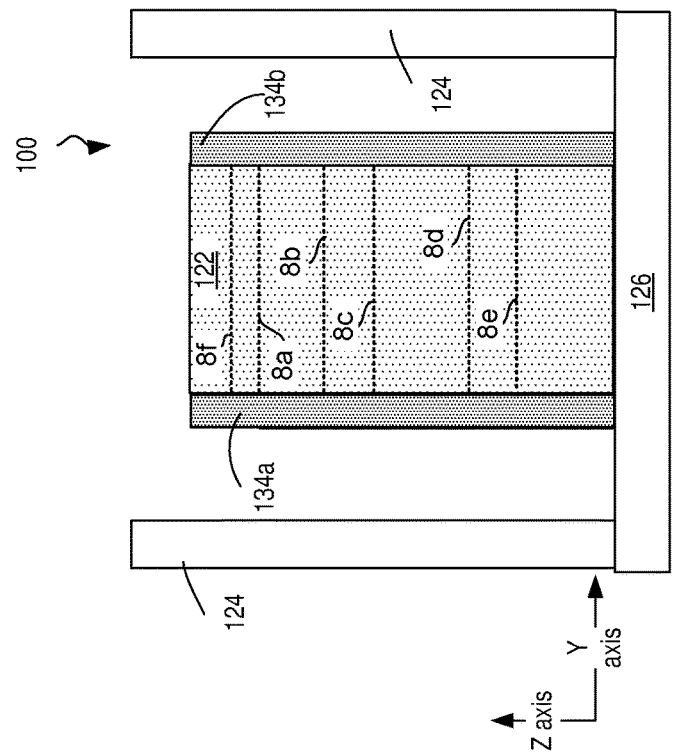
Fig. 6I2
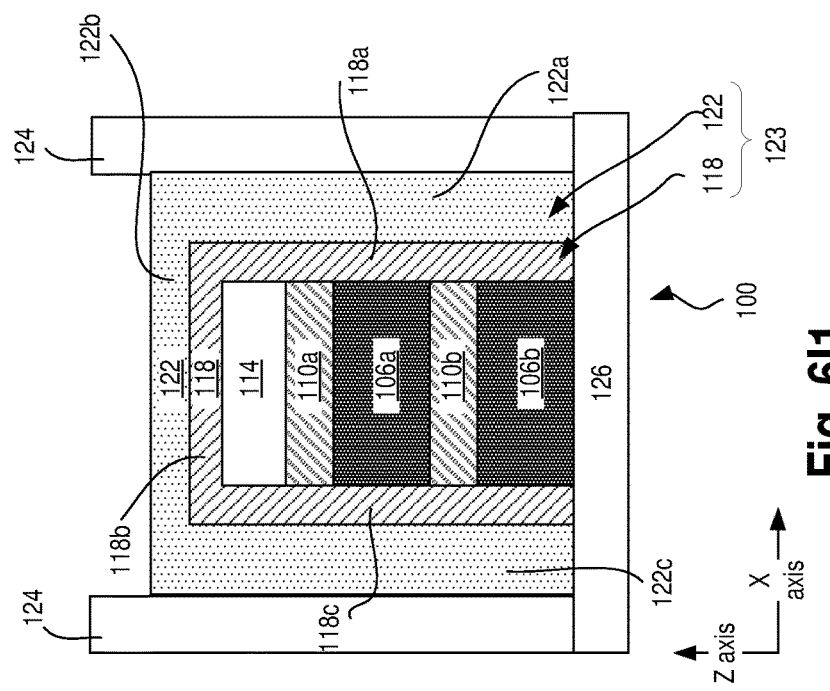
Fig. 6I1

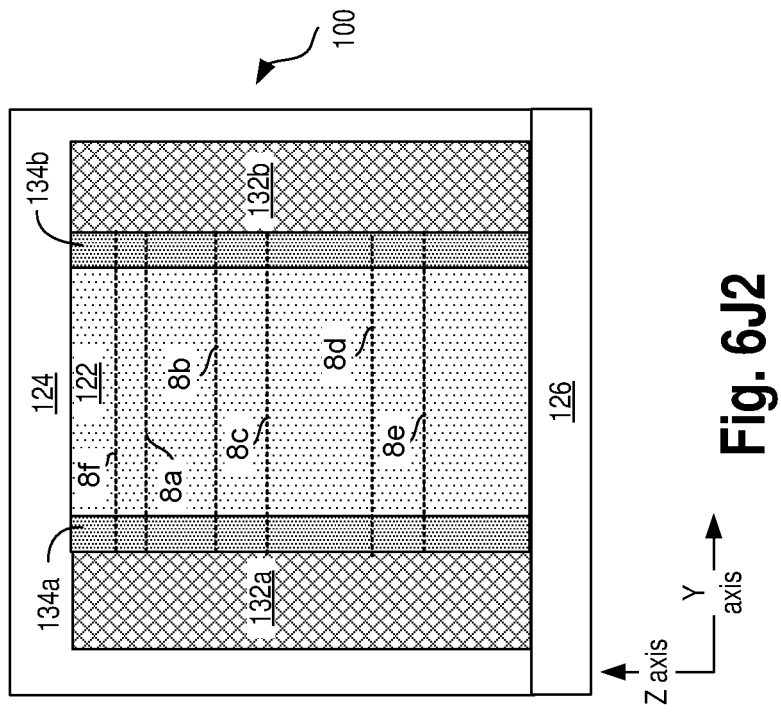
Fig. 6J2
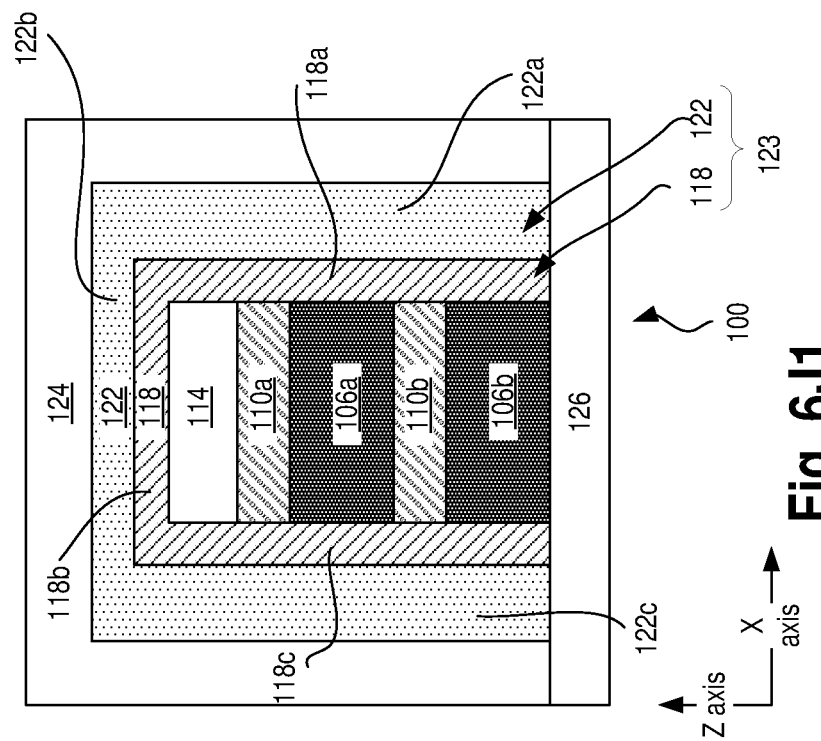
Fig. 6J1

THIN FILM TRANSISTOR WITH GATE STACK ON MULTIPLE SIDES

BACKGROUND

Thin-film transistors (TFTs) are a class of field-effect transistors (FETs) in which the channel material is a deposited thin film rather than a monocrystalline material. A common application of TFT technology is liquid crystal displays (LCD), but they are also advantageous in other applications as the thin film deposition processes employed in TFT fabrication are relatively low (e.g., below 450° C.). TFTs can be made using a wide variety of semiconductor materials, such as silicon, germanium, silicon-germanium, as well as various oxide semiconductors (also known as semiconducting oxides) including metal oxides like indium gallium zinc oxide (IGZO).

In some examples, in a TFT, due to scaling of gate length Lg, control of a gate stack over a short cannel may reduce. It may be useful to overcome such short channel effects.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 1A, 1B, 1C, 1D, and 1E illustrate various views of a TFT having a gate stack on multiple sides of one or more semiconductor thin films, in accordance with some embodiments.

FIG. 3 illustrate a cross-sectional view of a TFT having a gate stack on multiple sides of at least three stacked semiconductor thin films, in accordance with some embodiments.

FIG. 4 illustrate a cross-sectional view of a TFT having a gate stack on multiple sides of a single semiconductor thin film, in accordance with some embodiments.

FIGS. 6A, 6B, 6C, 6D, 6E, 6F, 6G1, 6G2, 6H1, 6H2, 6H3, 6I1, 6I2, 6J1, and 6J2 illustrate example processes for formation of a TFT having gate stack on two or more sides of one or more channel structures, according to some embodiments.

DETAILED DESCRIPTION

Figure 2B:
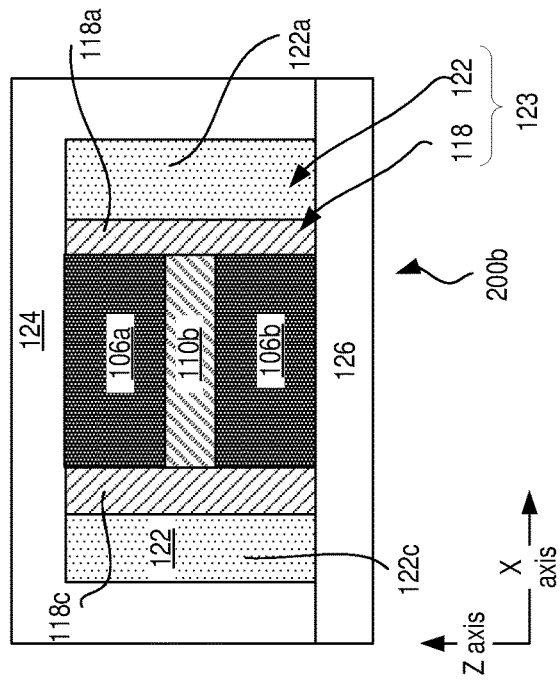
FIG. 2B illustrate a cross-sectional view of another TFT having a gate stack on a first side and a second side of one or more semiconductor thin films, in accordance with some embodiments.

In some examples, in a TFT, due to scaling of gate length Lg, control of the gate stack over a short cannel may reduce.

In some embodiments, to overcome or reduce such short channel effects, a TFT may comprise a gate stack on multiple sides of one or more thin films. For example, the gate stack may at least in part wrap around the thin semiconductor oxide film, where the thin semiconductor oxide film may form the channel. As the gate stack is on multiple sides of the thin film, the gate stack may have better control over the channel.

In some embodiments, a TFT may comprise multiple parallel channels (e.g., multiple parallel thin films). Thus, the parallel channels may be stacked, and separated by intervening passivation layers. The gate stack may be present on two or more sides of the parallel channels (e.g., wrap at least in part around the parallel channels). This may increase a current capacity of the TFT and may also increase a gate control over a relatively short channel. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or"

as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

It is pointed out that those elements of the figures having the same reference numbers (or names) as the elements of any other figure can operate or function in any manner similar to that described, but are not limited to such.

FIG. 1A illustrate a cross-sectional view (e.g., along X-Z axis) of a TFT 100 having a gate stack 123 on multiple sides of one or more semiconductor thin films 106*a*, 106*b*, in accordance with some embodiments. FIG. 1B illustrate another cross-sectional view (e.g., along Y-Z axis) of the TFT 100 of FIG. 1A, in accordance with some embodiments. FIG. 1C illustrates a side perspective view of the TFT 100 of FIG. 1A, in accordance with some embodiments. FIG. 1D illustrates the TFT 100 of FIG. 1A, along with some example dimensions, in accordance with some embodiments. FIG. 1E illustrate another cross-sectional view (e.g., along Y-Z axis) of the TFT 100, similar to the view of FIG. 1B (but without illustrating some of the components, such as gate stack 123 and spacers 134), in accordance with some embodiments.

Although FIGS. 1A-1B illustrate Interlayer Dielectric (ILD) 124 surrounding various components, the ILD 124 is not illustrated in FIG. 1C (e.g., to illustrate various components underneath the ILD 124). The view of FIG. 1A is along a plane that is vertically downwards from a line A-A' of FIG. 1C. The view of FIG. 1B is along a plane that is vertically downwards from a line B-B' of FIG. 1C.

In some embodiments, the TFT 100 comprises stacked thin films 106*a*, 106*b*. Although two thin films 106*a*, 106*b* are illustrated in FIGS. 1A-1C, one, three, or higher number of thin films may be present in the TFT 100.

Elements referred to herein with a common reference label followed by a particular number or alphabet may be collectively referred to by the reference label alone. For example, thin films 106*a*, 106*b* may be collectively and generally referred to as thin films 106 in plural, and thin film 106 in singular.

In some embodiments, the TFT 100 is formed on a substrate layer 126. In some embodiments, the substrate layer 126 is amorphous. In some embodiments, the substrate layer 126 comprises oxide material. Substrate layer 126 may be a dielectric material, such as, but not limited to, silicon dioxide (SiO), a silicon nitride (SiN), silicon oxynitride (SiON), or low-k dielectric (e.g., having a dielectric constant below 3.5). In some embodiments, the substrate 126 may be a flexible substrate, e.g., comprising flexible material such as, merely as examples, polyimide, PEEK (Polyether ether ketone), transparent conductive polyester film, and/or the like.

In some embodiments, the semiconductor thin films 106 may have any composition known to be suitable as a TFT channel material, such as a group IV material (e.g., Si, Ge, SiGe). In some embodiments, the semiconductor thin films 106 comprise an oxide semiconductor, e.g., a metal oxide semiconductor. In some embodiments, the semiconductor thin films 106 are a large bandgap type of metal oxide. An oxide semiconductor may be a semiconducting oxide. Oxide semiconductors may be advantageous for low temperature transistor fabrication, and may have excellent transistor characteristics offering high carrier mobility and a tunable material band gap and resistivity. Many oxide semiconductors have been studied, initially in the context of discrete rectifiers, and more recently in the context of transparent TFTs for display applications. Examples include metal oxides with a transition metal (e.g., IUPAC group 4-10) or post-transition metal (e.g., IUPAC groups 11-15). In some embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and/or mixtures thereof.

Oxide semiconductor thin films 106 may be a p-type, n-type, or intrinsic material. A number of oxide semiconductors have been found to be capable of significant electron densities. Some oxide semiconductors have also been found to be capable of significant electron hole densities. Many oxide semiconductors have high defect density nearer the valence band, but may display good n-type electrical properties. Some oxide semiconductors have high defect density in the conduction band, but may display good p-type electrical properties. In some embodiments, semiconductor thin film 106 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some embodiments, semiconductor thin films 106 comprise a zinc oxide ($ZnO_x$), such as Zn(II) oxide, or ZnO. In some embodiments, the zinc oxide is zinc peroxide ($ZnO_2$) or a mixture of ZnO and $ZnO_2$, where x may range between 1 and 2. In some embodiments, semiconductor thin films 106 comprise titanium oxide ($TiO_x$), or $SnO_x$. Exemplary oxide semiconductors that may have suitable p-type conductivity include copper oxide ($CuO_x$). In some $CuO_x$ embodiments, oxide semiconductor thin film 106 is Cu(I) oxide, or $Cu_2O$. In some embodiments, oxide semiconductor thin films 106 comprise Cu(II) oxide (CuO) or a mixture of CuO and $Cu_2O$, where x may range between 0.5 and 1. In some embodiments, semiconductor thin films 106 compositions include $NiO_x$.

Oxide semiconductor conductivity type is a function of composition. Although not bound by theory, the basis for n-type conductivity in many oxide semiconductors may be the presence of oxygen vacancies. The presence of other electrically active dopants, such as hydrogen, or one or more metal species, may also serve as a means of tuning the semiconducting properties of the oxide semiconductor. Semiconductor oxide thin films 106 may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H). Dopant levels in oxide semiconductor thin films 106 may be selected to arrive at optimal threshold voltage associated with gating the oxide semiconductor within the channel region and/or for lowest bulk and/or junction resistance within the source and/or drain region. Semiconductor thin films 106 may comprise $ZnO_x$ doped with In and Ga, for example. In some specific embodiments, semiconductor thin films 106 are $InGaO_3(ZnO)_5$, often referred to a simply IGZO.

In some embodiments, at least a section of a semiconductor thin film 106 may be a channel structure or a channel layer of the TFT 100. Accordingly, the semiconductor thin films 106 (or at least a section of the semiconductor thin films 106) may also be referred to herein as channel structures, channel layers, channel regions, channels, etc. In some embodiments, because the TFT 100 comprises multiple stacked thin films 106, the TFT 100 may have multiple, parallel channels.

In some embodiments, the thin films 106 may be separated by intervening passivation layers 110, e.g., such that the thin films 106 and the passivation layers 110 may be interleaved. For example, as illustrated in FIG. 1A, a passivation layer 110b separates the thin films 106a, 106b; and a passivation layer 110a is disposed on the thin film 106a.

In some embodiments, the passivation layers 110 are ILDs. For example, one or more of porous $SiO_2$, fluorine-doped $SiO_2$, carbon-doped $SiO_2$, porous-doped $SiO_2$, spin-on silicon based polymeric dielectric, spin-on organic polymeric dielectric, or another appropriate component generally used as passivation material may be used for the passivation layers 110.

In some embodiments, a ILD 114 may be deposited on the passivation layer 110a. Any appropriate dielectric material may be used for the ILD 114. In some embodiments, the ILD 114 and the passivation layer 110a may be combined or form a common layer of ILD material.

In some embodiments, the TFT 100 comprises a gate stack 123, where the gate stack 123 includes gate electrode 122 and gate dielectric 118. In an example, the gate dielectric 108 maybe between the gate electrode 122 and at least a section of the thin films 106. Thus, the gate dielectric 118 may be on multiple sides of the thin films 106, and the gate electrode 122 may be on multiple sides of the gate dielectric 118.

For example, as illustrated in FIG. 1A, the gate stack 123 may surround the stack of thin films 106 and passivation layers 110 on three sides (e.g., a fourth side of the stack may have the substrate layer 126). For example, a first side of the stack of thin films 106 and passivation layers 110 may have a section 118a of the gate dielectric 118 and a section 122a of the gate electrode 122; a second side of the stack of thin films 106 and passivation layers 110 may have a section 118b of the gate dielectric 118 and a section 122c of the gate electrode 122; a third side of the stack of thin films 106 and passivation layers 110 may have a section 118c of the gate dielectric 118 and a section 122c of the gate electrode 122; and a fourth side of the stack of thin films 106 and passivation layers 110 may have the substrate 126.

Depending on the conductivity type of the oxide semiconductor of the thin films 106, the gate stack 123 is to modulate the oxide semiconductor of the thin films 106 between intrinsic and n-type or p-type material through the field effect. To do so, gate dielectric 118 is to form an interface of suitable quality.

In some embodiments, the gate dielectric 118 comprises a high-k dielectric having a bulk relative dielectric constant greater than at least 9. The gate dielectric 118 may include one or more material layers. In some such embodiments, the high-k gate dielectric includes at least one of $Al_2O_3$, $HfO_2$, $HfAlO_x$, HfZrO, or ZrO in direct contact with the thin films 106. Silicates such as $HfSiO_x$ or $TaSiO_x$ may also be suitable for either direct contact with the thin films 106, or with an underlying interfacial layer of the gate dielectric 118. $HfO_2$ may give better gate control for zinc oxide (e.g., IGZO) embodiments than do alternatives such as $Al_2O_3$. However, both $Al_2O_3$, $HfO_2$ have been found to display results superior to a conventional silicon-based gate dielectric (e.g., $SiO_2$).

One or more material providing a suitable work function may be employed for gate electrode 122. In some embodiments, gate electrode 122 includes a metal with a work function below 5 eV. The metal gate electrode 122 may include an elemental metal layer, a metal alloy layer, or laminate structure of either or both. In some embodiments, the gate electrode 122 is a metal nitride, such as TiN (e.g., 4.0-4.7 eV). The gate electrode may also comprise Al (e.g., TiAlN). Other alloy constituents may also be employed, such as, but not limited to C, Ta, W, Pt, and Zn.

In some embodiments, as illustrated in FIGS. 1A-1B, the gate stack 123 may be encapsulated by an ILD 124. Any appropriate ILD material may be used, e.g., those discussed with respect to the passivation layers 110 and/or the ILD 114. Although FIGS. 1A-1B illustrate the ILD 124 surrounding the gate stack 123, the ILD 124 is not illustrated in FIG. 1C (e.g., to illustrate various components underneath the ILD 124).

In some embodiments, the TFT 100 further comprises contact metallization, such as source/drain contacts 132a, 132b. The source/drain contacts 132a, 132b are not visible in the view of FIG. 1A. For example, if the cross-sectional view of FIG. 1A is assumed to be on a paper, then the source/drain contact 132a may be in front of or ahead of the paper, and the source/drain contact 132b may be in at the back or behind the paper. The source/drain contacts 132a, 132b are illustrated in FIGS. 1B, 1C.

Thus, for example, if a thin film (e.g., thin film 106a) is assumed to have a shape of a rectangular cuboid having six surfaces, a top surface of the thin film 106a is adjacent to the passivation layer 110a, a bottom surface of the thin film 106a is adjacent to the passivation layer 110b, a first two opposing side surfaces are respectively adjacent to the section 118a and 118c of the gate dielectric 118, and a second two opposing side surfaces are respectively adjacent to the source/drain contacts 132a, 132b.

FIG. 1E illustrate another cross-sectional view (e.g., along Y-Z axis) of the TFT 100, similar to the view of FIG. 1B (but without illustrating some of the components, such as gate stack 123 and spacers 134), in accordance with some embodiments. Thus, as seen in FIG. 1E, the side surfaces of the thin films 106 and the passivation layers 110 are adjacent to the source/drain contacts 132a, 132b.

In some embodiments, the thin films 106 may be substantially compositionally homogeneous. For example, a channel region disposed adjacent to the gate stack 123 may have the same oxide semiconductor composition as regions disposed adjacent to the source/drain contacts 132. As such, the thin films 106 may be coupled to source/drain contacts 132 through semiconductor homojunctions. In alternative embodiments, the thin film 106 is compositionally heterogeneous between the channel region and at least one source/drain region. The TFT channel region is then coupled to source/drain contacts 132 through semiconductor heterojunctions.

Source/drain contacts 132 may have any metal composition that when interfacing the chosen oxide semiconductor of the thin film 106 will, either as deposited, or upon subsequent annealing, have suitable contact resistance. Source/drain contacts 132 may advantageously have a relatively low affinity for oxygen to limit gettering oxygen from the semiconductor thin film 106.

In some embodiments, source/drain contacts 132 include a metal nitride at the interface of (e.g., in direct contact with) the thin film 106. Metal nitrides offer good stability and do not ready oxidize. Exemplary metal nitrides include TiN, TaN, and WN. In other embodiments, source/drain contacts 132 include a noble metal (e.g., Pt) at the interface of (e.g., in direct contact with) the thin film 106. In some embodiments, source/drain contacts 132 include doped oxide, such as Aluminum doped ZnO, and/or another appropriate doped oxide.

In some embodiments, the TFT 100 comprises spacer 134a disposed between the gate stack 123 and the source/drain contact 132a, and spacer 134b disposed between the gate stack 123 and the source/drain contact 132b. The spacers 134a, 134b are not visible in the view of FIG. 1A. For example, if the cross-sectional view of FIG. 1A is assumed to be on a paper, then the spacers 134a, 134b may be in front or ahead of the paper, and the spacers 134a, 134b may be in at the back or behind the paper. The spacers 134a, 134b are illustrated in FIGS. 1B, 1C.

In some embodiments, the spacers 134 may be self-aligned gate sidewall spacers that separate source/drain contacts 132 from sidewalls of the gate electrode 122 and gate dielectric 118 (e.g., y-dimension separation of 5-20 nm). In some embodiments, each of the spacers 134 has a lateral width (e.g., y-dimension) of 5-20 nm.

In some embodiments, spacers 134 may be of any composition known to have properties suitable as an insulator separating gate stack 123 from source/drain contacts 132. The spacers 134 may be SiO, SiN, SiON, or any known low-k material (e.g., SiOC, etc.).

It may be noted that the gate dielectric 118, thin films 106, the passivation layers 110, and the ILD 114 are not visible in the views of FIGS. 1B and 1C, because these components are covered by the gate electrode 122 and the spacers 134 in these two figures. However, the outlines of these components are symbolically illustrated using dotted lines 8a, 8b, 8c, 8d, 8e, and 8f (the dotted lines 8a, . . . , 8f are illustrated in both FIGS. 1B and 1C, but are labelled only in FIG. 1B). For example, the dotted line 8e symbolically illustrates a boundary between the thin film 106b and the passivation layer 110b; the dotted line 8d symbolically illustrates a boundary between the passivation layer 110b and the thin film 106a; the dotted line 8c symbolically illustrates a boundary between the thin film 106a and the passivation layer 110a; the dotted line 8b symbolically illustrates a boundary between the passivation layer 110a and the ILD 114; the dotted line 8a symbolically illustrates a horizontal boundary between the ILD 114 and the gate dielectric 118; and the dotted line 8f symbolically illustrates a horizontal boundary between the section 122b of the gate electrode 122 and the section 118b of the gate dielectric 118.

FIG. 1D illustrates the TFT 100 of FIGS. 1A-1E along with some example dimensions. For example, a Z-axis height of the thin film 106b adjacent to the gate stack 123 may be (Z1+Z1), and a Z-axis height of the thin film 106a adjacent to the gate stack 123 may be (Z2+Z2), as illustrated in FIG. 1D. In an example, Z1=Z2. Thus, the TFT 100 allows maintaining (2Z1+2Z2) length between the channel comprising the thin films 106 and the gate stack 123.

In a conventional TFT having scaled gate length Lg, the interface between the channel and the gate stack is relatively less (e.g., due to the scaling of the gate length Lg). This may result in short-channel effect, where a control of the gate stack on the channel may be relatively less due to the short length of the channel interfacing with the gate stack. In contrast, in the TFT 100, the gate stack 123 surrounds the channel (e.g., the thing films 106) from multiple sides. For example, the gate stack is adjacent to each of the thin films 106a, 106b on two sides. This may result in channel control from more than one side, thereby providing better short channel control. The better control of the channel may allow for short gate length Lg of 50 nanometers (nm) or less.

Figure 2A:
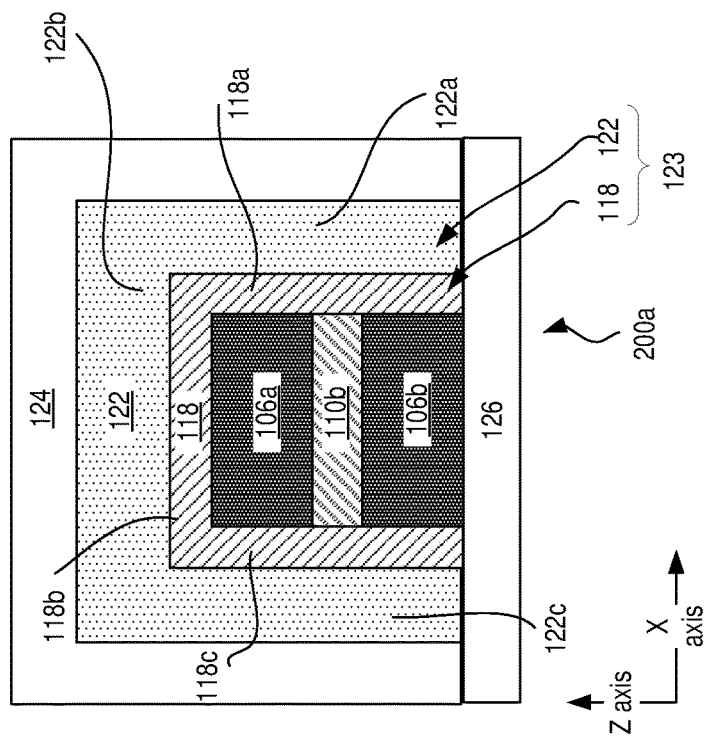
FIG. 2A illustrate a cross-sectional view of another TFT having a gate stack on multiple sides of one or more semiconductor thin films, in accordance with some embodiments.

FIG. 2A illustrate a cross-sectional view (e.g., along X-Z axis) of a TFT 200a having a gate stack 123 on multiple sides of one or more semiconductor thin films 106a, 106b, in accordance with some embodiments. The TFT 200a of FIG. 2A is at least in part similar to TFT 100 of FIGS. 1A-1E. However, unlike the TFT 100, the TFT 200a does not include the passivation layer 110a and the ILD 114. This may result in even higher control of the gate stack 123 over the channel comprising the thin film 106a. The TFT 200a of FIG. 2A will be evident to those skilled in the art, based on the discussion of the TFT 100 of FIGS. 1A-1E. Hence, the TFT 200a will not be discussed in further detail herein.

FIG. 2B illustrate a cross-sectional view (e.g., along X-Z axis) of a TFT 200b having a gate stack 123 on a first side and a second side of one or more semiconductor thin films 106a, 106b, in accordance with some embodiments. The TFT 200b of FIG. 2B is at least in part similar to TFT 100 of FIGS. 1A-1E. However, unlike the TFT 100, the gate stack 123 of the TFT 200a does not include the top sections 118b, 122b. For example, a top surface of the gate stack 123 may be co-planar with a top surface of the thin film 106a. Thus, the gate stack 123 may be on two sides (but not on top) of the thin film 106a. In an example, the gate stack 123 may be electrically coupled via an appropriate connection (e.g., not illustrated in FIG. 2B). The TFT 200b of FIG. 2B will be evident to those skilled in the art, based on the discussion of the TFT 100 of FIGS. 1A-1E. Hence, the TFT 200b will not be discussed in further detail herein.

The TFT 100 of FIGS. 1A-1E has two thin film layers 106a, 106b. However, the number of thin films 106 may be different. For example, FIG. 3 illustrate a cross-sectional view (e.g., along X-Z axis) of a TFT 300 having a gate stack 123 on multiple sides of at least three stacked semiconductor thin films 106a, 106b, 106c, in accordance with some embodiments. FIG. 4 illustrate a cross-sectional view (e.g., along X-Z axis) of a TFT 400 having a gate stack 123 on multiple sides of a semiconductor thin film 106a in accordance with some embodiments. In an example, the TFT 300 may have higher current rating that the TFT 100, e.g., as there are more number of parallel channels (e.g., thin films 106a, 106b, 106c) in the TFT 200 than the TFT 100 of FIGS. 1A-1E.

The TFTs 300 and 400 may be at least in part similar to the TFT 100 of FIGS. 1A-1E. However, unlike the TFT 100 that has two thin films 106a, 106b, the TFT 300 has three thin films 106a, 106b, and 106c (and an additional passivation layer 110c), and the TFT 400 has merely one thin film 106a. The TFTs 300 and 400 of FIGS. 3 and 4, respectively, will be evident to those skilled in the art, based on the discussion of the TFT 100 of FIGS. 1A-1D. Hence, the TFTs 300 and 400 will not be discussed in further detail herein.

Figure 5B:
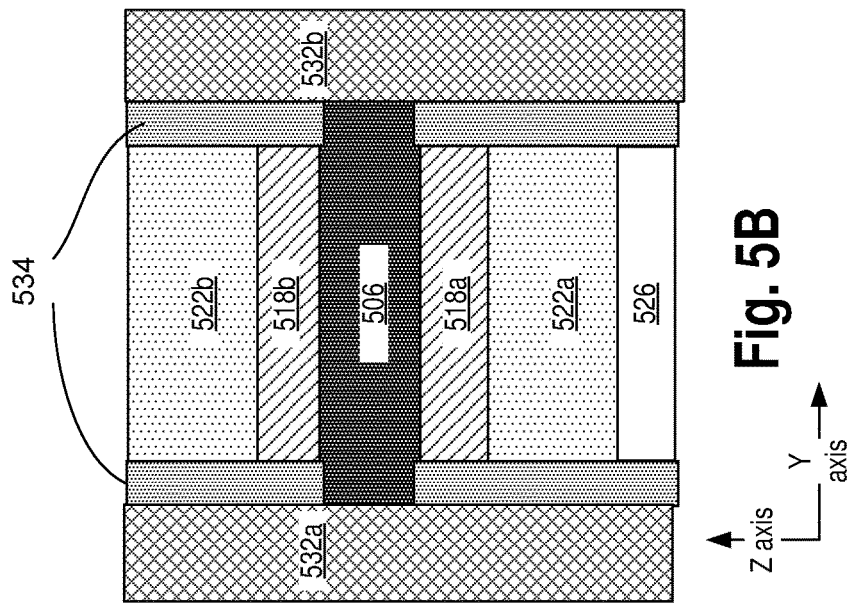
FIGS. 5A-5B illustrate a double gate TFT, in accordance with some embodiments.
Figure 5A:
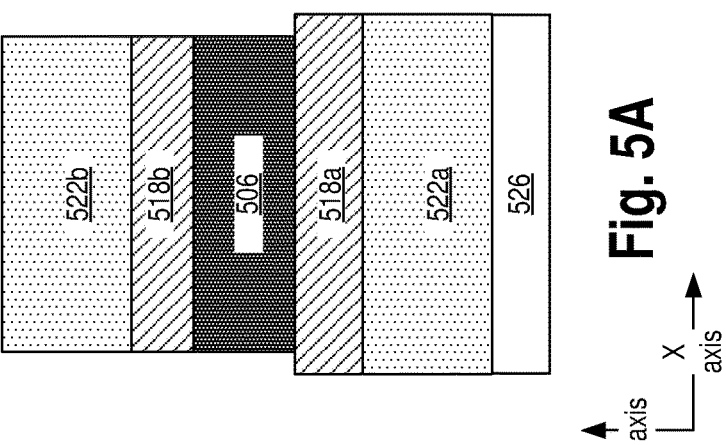

FIG. 5A illustrate a cross-sectional view (e.g., along X-Z axis) of a double gate TFT 500, in accordance with some embodiments. FIG. 5B illustrate a cross-sectional view (e.g., along Y-Z axis) of the double gate TFT 500 of FIG. 5A, in accordance with some embodiments.

The TFT 500 comprises a thin film 506. A first gate stack comprising gate dielectric 518a and gate electrode 522a is disposed on a first side of the thin film 506, and a second gate stack comprising gate dielectric 518b and gate electrode 522b is disposed on a second side of the thin film 506. The gate electrode 522a may be on a substrate 526. Source/drain contacts 532a, 532b in the TFT 500 may be in front of the thin film 506 and behind the thin film 506, as illustrated in Y-Z plane view of FIG. 5B. In some embodiments, the source/drain contacts 532a, 532b may be separated from the gate stacks by corresponding spacers 534. Various layers of the TFT 500 may be at least in part compositionally similar to those discussed with respect to FIGS. 1A-4.

FIGS. 6A, 6B, 6C, 6D, 6E, 6F, 6G1, 6G2, 6H1, 6H2, 6H3, 6I1, 6I2, 6J1, and 6J2 illustrate example processes for formation of a TFT with a gate stack on two or more sides of one or more channel structures, e.g., the TFT 100 of FIGS. 1A-1E, according to some embodiments. For example, FIGS. 6A-6I2 are cross-sectional views of the TFT 100 evolving as example operations for formation of the TFT 100 are performed.

Referring to FIG. 6A, a stack comprising thin films 106a, 106b, interleaved with intervening layers (e.g., passivation layers 110b, 110b) are formed on the substrate 126. The ILD 114 is formed on the passivation layer 110a. It may be noted that the view in FIG. 6A is along the X-Z plane, e.g., similar to that of FIG. 1A.

Any deposition process known to be suitable for a desired oxide semiconductor composition or a passivation material may be performed to deposit the various layers in FIG. 6A, such as, but not limited to pulsed laser deposition (PLD), oxidation processing where a precursor is spin-coated and oxidized during an anneal, chemical vapor deposition (CVD), and atomic layer deposition (ALD).

Referring now to FIG. 6B (which is illustrated along the X-Z plane), the layers 106b, 110b, 106a, 110a, 114 are patterned, e.g., in a fin like structure. Any appropriate patterning technique (e.g., photolithography) may be used. Referring now to FIG. 6C (which is illustrated along the X-Z plane), the patterned layers 106b, 110b, 106a, 110a, and 114 may be encapsulated by the ILD 124. Referring now to FIG. 6D (which is illustrated along the X-Z axis), the ILD 124 may be selectively opened, e.g., to form recesses (e.g., within which the gate dielectric 118 may be deposited).

Referring now to FIG. 6E (which is illustrated along the X-Z plane), the gate dielectric 118, comprising any of the materials introduced above, is deposited over (e.g., in direct contact with) the patterned layers 106, 110, 114. In some embodiments, an appropriate deposition process (e.g., a ALD process) is employed to deposit a high-k gate dielectric film directly on a surface of the patterned stack of thin films 106 and passivation layer 110.

FIGS. 6C-6E illustrate formation of gate dielectric 118 by depositing the ILD 124, patterning the ILD 124 to form cavity or recess, and then depositing the gate dielectric 118 in the recess. In some other examples, the gate dielectric 118 may be formed in a different manner. For example, after formation of the component of FIG. 6B, the gate dielectric 118 may be deposited on the stack comprising the layers 106, 110, and 114 (e.g., prior to deposition of the ILD 124).

The ILD 124 may be deposited after formation of the gate dielectric 118. In such examples, the ILD 124 need not be patterned to form the gate dielectric 118.

Referring now to FIG. 6F (which is illustrated along the X-Z plane), the ILD 124 may be selectively opened, e.g., to form recesses (e.g., within which the gate electrode 122 may be deposited). Referring now to FIGS. 6G1 and 6G2, illustrated are formation of the gate electrode 122 within the recesses of the ILD 124. FIG. 6G1 illustrates a cross-sectional view along the X-Z plane, whereas FIG. 6G2 illustrates a cross-sectional view along the Y-Z plane. As the gate electrode 122 (and also the gate dielectric 118) at least in part wraps around the thin films 106, the passivation layers 110 and the ILD 114, these structures are not fully visible in FIG. 6G2. For example, the gate electrode 122 wraps around the mid-sections of the thin films 106, the passivation layers 110 and the ILD 114, and the two end sections of these structures are not wrapped by the gate electrode 122 or the gate dielectric 118. The mid sections of the thin films 106, the passivation layers 110 and the ILD 114, which are wrapped by the gate electrode 122 and the gate dielectric 118, are not visible in the Y-Z plane view of FIG. 6G2, and are symbolically illustrated using dotted lines 8a, . . . , 8f, as discussed with respect to FIGS. 1B-1C. In some embodiments, gate electrode 122 is deposited by CVD, ALD, physical vapor deposition (PVD), or any other technique known to be suitable for forming the desired material.

Referring now to FIGS. 6H1 and 6H2, illustrated are formation of the spacers 134a, 134b, where the spacers 134 wraps around the two end sections of the thin films 106, the passivation layers 110 and the ILD 114. FIG. 6H1 illustrates a cross-sectional view along the X-Z plane, whereas FIG. 6H2 illustrates a cross-sectional view along the Y-Z plane. Also, FIGS. 6G1 and 6H1 are identical, as the spacers 134 are not deposited on the cross-sectional along the X-Z plane illustrated in these two figures.

FIG. 6H3 is a side-view of the TFT illustrated in FIGS. 6H1 and 6H2, when viewed from the side of the arrow 601h of FIG. 6H2. The ILD 124 is not illustrated in FIG. 6H3. As illustrated in FIG. 6H3, an end section of the thin films 106, the passivation layers 110 and the ILD 114 are wrapped by the spacer 134a. The gate stack 122 (not illustrated in the side view of FIG. 6H3) is behind the spacer 134a in the view of FIG. 6H3. As illustrated, ends of the thin films 106, the passivation layers 110 and the ILD 114 are exposed through the spacers 134.

Referring now to FIGS. 6I1 and 6I2, the ILD 124 may be selectively patterned to form recesses for the source/drain contacts 132. FIG. 6I1 illustrates a cross-sectional view along the X-Z plane, whereas FIG. 6I2 illustrates a cross-sectional view along the Y-Z plane. The patterning of the ILD 124 may be visible in the Y-Z plane of FIG. 6I2.

Referring now to FIGS. 6J1 and 6J2, the source/drain contacts may be formed in the recess within the ILD 124 of FIGS. 6I1, 6I2, and top sections of the resultant TFT may optionally be covered with the ILD 124. FIG. 6J1 illustrates a cross-sectional view along the X-Z plane, whereas FIG. 6J2 illustrates a cross-sectional view along the Y-Z plane. Any deposition process known to be suitable for depositing a particular contact metallization composition for the source/drain contacts 132 may be performed. In some embodiments, the deposition process induces order in the contact metallization. In the exemplary embodiment shown in FIGS. 6J1, 6J2, contact metallizations 132a, 132b are deposited in direct contact with two respectively ends of the thin films 106, the passivation layers 110 and the ILD 114.

In some embodiments, contacts 132 may be deposited by a technique that favors the formation of grains at an interface with the semiconductor thin films 106. Contacts 132 may be deposited by a technique that favors columnar growth of grains formed at the interface of the semiconductor thin films 106. In some embodiments, PVD or ALD is employed to deposit a metal nitride (e.g., TiN) directly on semiconductor thin films 106. The resultant TFT illustrated in FIGS. 6J1, 6J2 may be the TFT 100 of FIGS. 1A-1E.

Figure 7:
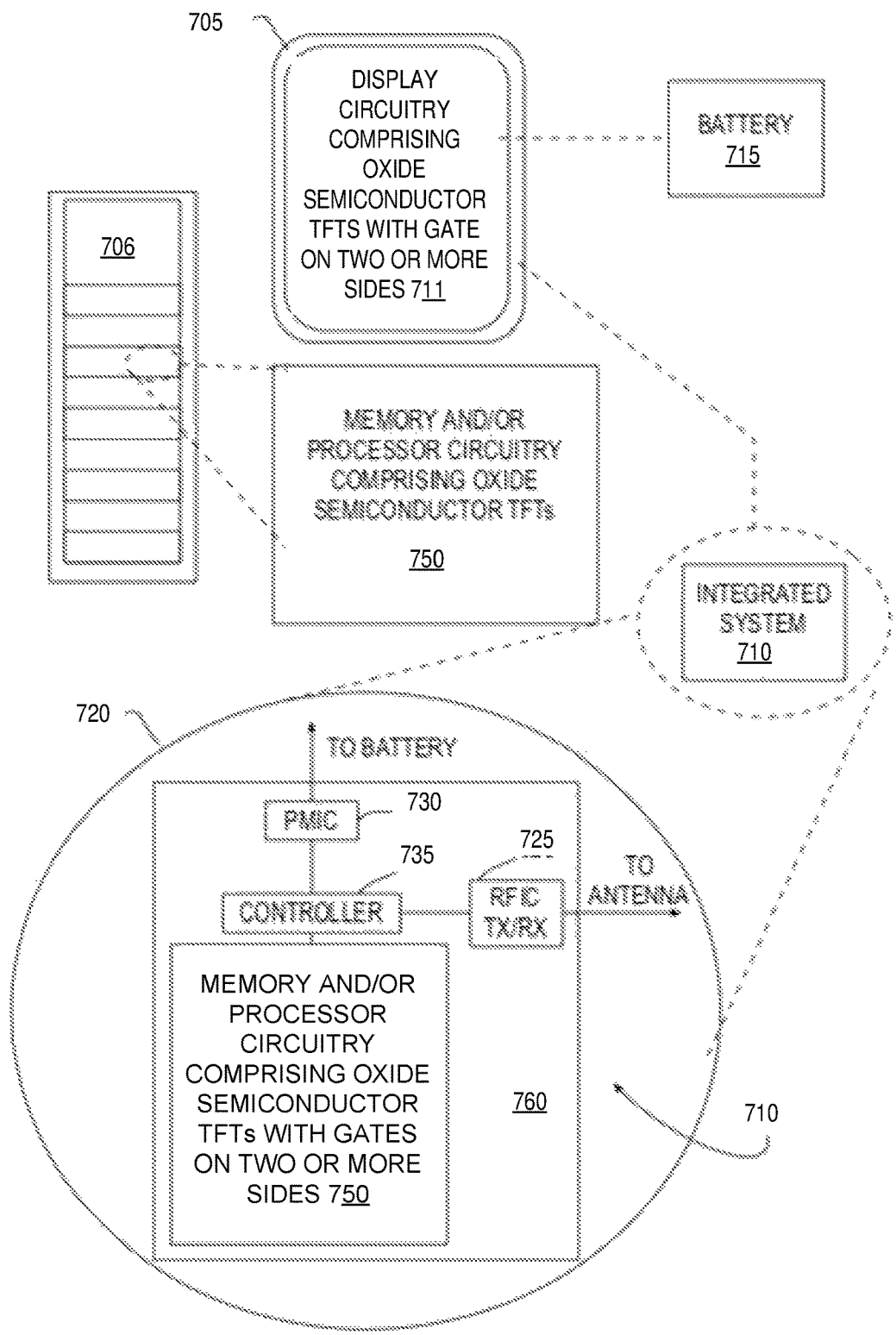
FIG. 7 illustrates a mobile computing platform and a data server machine employing an SoC including TFTs with gate stack on multiple sides of one or more thin films, according to some embodiments.

FIG. 7 illustrates a mobile computing platform 705 and a data server machine 706 employing an SoC including TFTs with gate stack on multiple sides of one or more thin films, according to some embodiments. The server machine 706 may be any commercial server, for example including any number of high-performance computing platforms within a rack and networked together for electronic data processing, which in the exemplary embodiment includes a packaged monolithic SoC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Either within the integrated system 710 illustrated in the expanded view 720, or as a stand-alone packaged chip within the server machine 706, monolithic SoC 750 includes a memory block (e.g., RAM), a processor block (e.g., a microprocessor, a multi-core microprocessor, graphics processor, or the like) including at least one TFT with gate stack on multiple sides, for example as described elsewhere herein. The monolithic SoC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller 735. In some example, a display circuitry 711 may comprise at least one TFT with selectively gate stack on multiple sides, for example as described elsewhere herein.

Functionally, PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G+, and beyond. In alternative implementations, each of these board-level modules may be integrated onto separate ICs or integrated into monolithic SoC 550.

Figure 8:
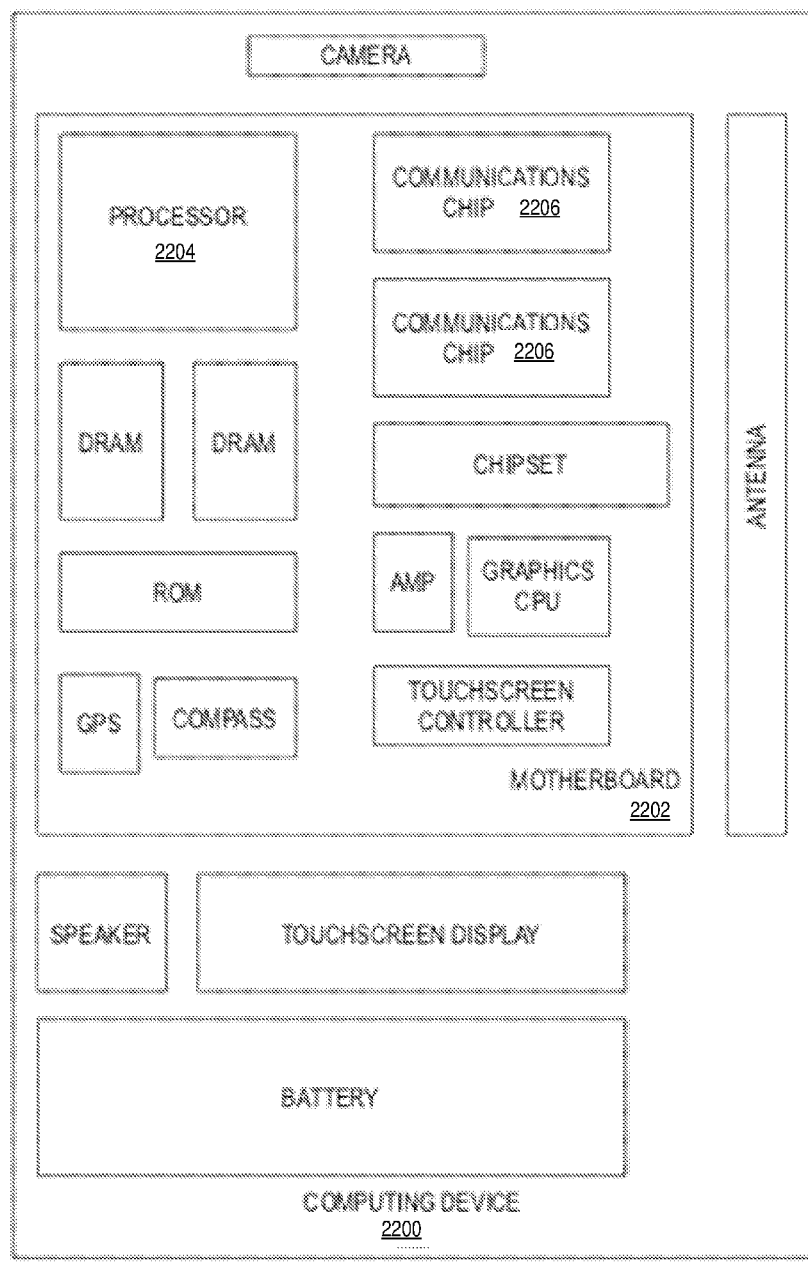
FIG. 8 illustrates a functional block diagram of an electronic computing device comprising a TFT with a gate stack on multiple sides of one or more thin films, according to some embodiments.

FIG. 8 illustrates a functional block diagram of an electronic computing device 2200 comprising TFTs with a gate stack on multiple sides of one or more thin films, according to some embodiments. Computing device 2200 may be found inside platform 705 or server machine 706, for example. Device 2200 further includes a motherboard 2202 hosting a number of components, such as, but not limited to, a processor 2204 (e.g., an applications processor), which may further incorporate at least one TFT with gate stack on multiple sides, for example as described elsewhere herein. Processor 2204 may be physically and/or electrically coupled to motherboard 2202. In some examples, processor 2204 includes an integrated circuit die packaged within the processor 2204. In general, the term "processor" or "microprocessor" may refer to any device or portion of a device that processes electronic data from registers and/or memory to transform that electronic data into other electronic data that may be further stored in registers and/or memory.

In various examples, one or more communication chips 2206 may also be physically and/or electrically coupled to the motherboard 2202. In further implementations, communication chips 2206 may be part of processor 2204. Depending on its applications, computing device 2200 may include other components that may or may not be physically and electrically coupled to motherboard 2202. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 2206 may enable wireless communications for the transfer of data to and from the computing device 2200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2206 may implement any of a number of wireless standards or protocols, including but not limited to those described elsewhere herein. As discussed, computing device 2200 may include a plurality of communication chips 2206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

We claim:

1. A thin film transistor (TFT) apparatus comprising:
   a plurality of stacked structures comprising metal oxide, wherein two adjacent structures of the plurality of stacked structures are separated by a structure;
   gate dielectric material on at least a first side and a second side of the plurality of stacked structures; and
   a gate electrode comprising a first section and a second section, wherein the first and second sections of the gate electrode are respectively on the first side and the second side of the plurality of stacked structures.

2. The TFT apparatus of claim 1, wherein the gate electrode comprises a third section to couple the first and second sections, and wherein the third section of the gate electrode is on a third side of the plurality of stacked structures.

3. The TFT apparatus of claim 2, wherein the gate dielectric material is a first gate dielectric material, wherein the TFT further comprising:
   a second gate dielectric material on the third side of the plurality of stacked structures.

4. The TFT apparatus of claim 2, further comprising:
   a substrate on a fourth side of the plurality of stacked structures,
   wherein the third side and the fourth side are two parallel sides of the plurality of stacked structures, and
   wherein the third side and the fourth side are substantially orthogonal to the first side and the second side.

5. The TFT apparatus of claim 1, wherein the gate dielectric material is to separate the plurality of stacked structures from the gate electrode.

6. The TFT apparatus of claim 1, wherein the first side and the second side are two substantially parallel sides of the plurality of stacked structures, and wherein the TFT apparatus further comprises:
   a first source or drain contact on a third side of the plurality of stacked structures; and
   a second source or drain contact on a fourth side of the plurality of stacked structures,
   wherein the third side and the fourth side are two substantially parallel sides of the plurality of stacked structures, and
   wherein the third side and the fourth side are substantially orthogonal to the first side and the second side.

7. The TFT apparatus of claim 6, further comprising:
   a first spacer to separate the gate electrode from the first source or drain contact; and
   a second spacer to separate the gate electrode from the second source or drain contact.

8. The TFT apparatus of claim 1, wherein the plurality of stacked structures comprises a plurality of parallel channel regions of the TFT apparatus.

9. The TFT apparatus of claim 1, wherein the plurality of stacked structures comprises metal oxide which includes one or more of: Cu, Zn, Sn, Ti, Ni, Ga, In, Sb, Sr, Cr, Co, V, Mo, or O.

10. The TFT apparatus of claim 1, wherein the gate dielectric material comprises a high-K dielectric material comprising one or more of: Hf, Si, O, Zr, Al, or N.

11. The TFT apparatus of claim 1, wherein the structure is a first structure, and wherein the TFT apparatus further comprising:
   a plurality of second structures interleaved with the plurality of stacked structures.

12. The TFT apparatus of claim 11, wherein individual one of the second structure comprises a passivation material.

13. A system comprising:
- a memory to store instructions;
- a processor to execute the instructions; and
- a wireless interface to communicatively couple the processor with another device,
- wherein an integrated circuit (IC) of the system comprises one or more of the memory, the processor, or the wireless interface, and wherein the IC comprises a thin film transistor (TFT) comprising:
    - a first semiconductor structure comprising metal oxide, and a second semiconductor structure comprising metal oxide, wherein the first and second semiconductor structures are separated by a layer comprising a passivation material, and
    - a gate stack on at least a first side and a second side of at least one of the first or second semiconductor structures.

14. The system of claim 13, wherein the TFT further comprises:
- a first source or drain contact on a third side of the at least one of the first or second semiconductor structures; and
- a second source or drain contact on a fourth side of the at least one of the first or second semiconductor structures.

15. The system of claim 14, wherein the TFT further comprises:
- a substrate on a fifth side of the at least one of the first or second semiconductor structures,
- wherein the layer comprising passivation material is on a sixth side of the at least one of the first or second semiconductor structures.

16. The system of claim 13, wherein the at least one of the first or second semiconductor structures comprises one or more of: Cu, Zn, Sn, Ti, Ni, Ga, In, Sb, Sr, Cr, Co, V, Mo, or O.

17. The system of claim 13, wherein the gate stack is on at least the first side and the second side of both the first and second semiconductor structures.

18. A method of fabricating a thin film transistor (TFT) structure, the method comprising:
- forming a stack, the stack comprising: a first structure comprising oxide semiconductor, a first intervening structure comprising passivation material, and a second structure comprising oxide semiconductor;
- depositing dielectric material on two or more sides of the stack; and
- forming gate electrode comprising metal on the dielectric material, such that the gate electrode is on two or more sides of the stack.

19. The method of claim 18, wherein a gate stack comprising the gate electrode and the dielectric material is on a first side and a second side of the stack, and wherein the method further comprises:
- forming a first source or drain contact of a third side of the stack, and a second source or drain contact of a fourth side of the stack,
- wherein the first source or drain contact and the second source or drain contact are adjacent to the third and fourth sides, respectively, of the first and second structures.

20. The method of claim 19, further comprising:
- forming a first spacer to isolate the first source or drain contact from the gate stack; and
- forming a second spacer to isolate the second source or drain contact from the gate stack.

* * * * *